March 26, 1974 F. W. SCHNEBLE, JR., ET AL 3,799,816

METALLIZING INSULATING BASES

Original Filed March 5, 1970 3 Sheets-Sheet 1

INVENTORS
FREDERICK W. SCHNEBLE, Jr.
JOHN F. McCORMACK
RUDOLPH J. ZEBLISKY
JOHN DUFF WILLIAMSON
JOSEPH POLICHETTE

BY Morgan, Finnegan, Durham & Pine
ATTORNEYS

INVENTORS
FREDERICK W. SCHNEBLE, Jr.
JOHN F. McCORMACK
RUDOLPH J. ZEBLISKY
JOHN DUFF WILLIAMSON
JOSEPH POLICHETTE
BY
Morgan, Finnegan, Durham & Pine
ATTORNEYS INVENTORS
FREDERICK W. SCHNEBLE, Jr.
JOHN F. McCORMACK
RUDOLPH J. ZEBLISKY
JOHN DUFF WILLIAMSON
JOSEPH POLICHETTE
BY
Morgan, Finnegan, Durham & Pine
ATTORNEYS 3,799,816
Patented Mar. 26, 1974

3,799,816

METALLIZING INSULATING BASES

Frederick W. Schneble, Jr., Oyster Bay, John F. McCormack, Roslyn Heights, Rudolph J. Zeblisky, Hauppauge, John Duff Williamson, Miller Place, and Joseph Polichette, South Farmingdale, N.Y., assignors to Photocircuits Corporation, Glen Cove, N.Y.

Continuation of abandoned application Ser. No. 16,846, Mar. 5, 1970. This application Jan. 11, 1972, Ser. No. 217,047
Int. Cl. C23f *1/02;* B44d *1/092*
U.S. Cl. 156—3 7 Claims

ABSTRACT OF THE DISCLOSURE

According to this invention, an improved process for selective metallization of insulating substrata, as for example in the manufacture of printed circuits, decorative articles, automobile trim, and the like, is provided which comprises coating an insulating, seeder repellent mask on the surface of a suitable insulating base so as to leave exposed selected areas to be metallized, contacting the board with a seeder solution to thereby render the exposed areas of the board not protected by the seeder repellent mask catalytic to the reception of electroless metal, and contacting the board with an electroless metal deposition solution to metallize the exposed catalytic areas of the board not protected by the seeder repellent mask.

Figure 1:
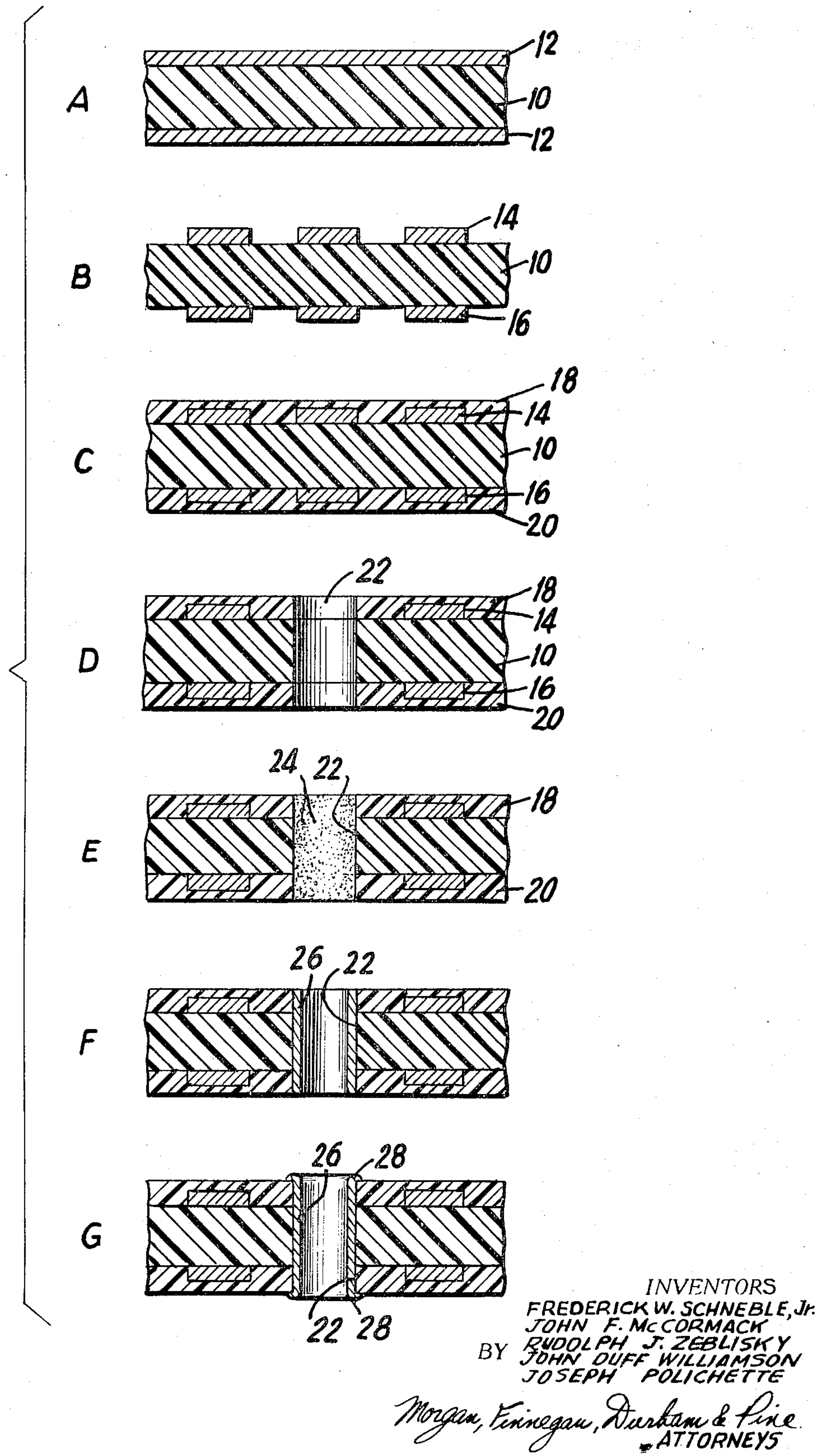

This is a continuation of application Ser. No. 16,846, filed Mar. 5, 1970, now abandoned.

Although the invention will be described principally in terms of the production of plated through hole printed circuit boards, other metallized products including other printed circuit boards may also be advantageously produced by following the teachings herein.

Printed circuits having holes extending through the base panel, the walls of which are plated, are well known and have become established in the art because of their reliability and the ease with which such holes may be used for attaching components to the printed circuit boards by soldering or otherwise.

In conventional printed circuit manufacturing practice, plated through hole printed circuit boards are produced with the metal circuit lines on the board surfaces exposed, i.e. uncovered or uncoated. Before soldering, e.g., dip soldering, a registered solder mask is conventionally printed over the circuit pattern(s), to leave holes and lands or pads (i.e, small areas on the surface surrounding the holes) as well as fingers (i.e., terminal or contact areas of the circuit pattern) exposed. Subsequently, the circuit is solder plated as by dipping in a solder bath to plate solder on the exposed areas, e.g., on the exposed lands, fingers and in the metallized holes. The mask protects the major portion of the circuit pattern from the solder and thus guards against short circuiting by the solder of the conductor lines making up the circuit pattern.

In the manufacture of such conventional circuit boards, the lands or pads and fingers as well as the hole walls are exposed while the conductor lines making up the conductor pattern or patterns are protected by the solder mask.

According to a preferred embodiment of this invention, there are provided improved procedures for producing plated through hole printed circuit boards which are protected from solder bridging during assembly and re-working by registered or nonregistered seeder repellent solder masks. For example, a circuit pattern is imposed on the surface or surfaces of a base, following which the pattern is coated in any one of a variety of ways, with a seeder repellent solder mask which covers at least a portion and generally the entire circuit pattern. Holes through the mask and base defining cross-overs are then established in the board following which the hole walls are metallized to provide through board electrical connections.

The boards of this invention are characterized by plated through holes capable of forming highly reliable solder joints. The plated through holes may comprise lands or pads spaced from the plane of the conductor line or lines making up the circuit pattern, but nevertheless in electrical contact with the plated holes.

Other rugged, durable and reliable printed circuit boards may be made following the teachings herein, including one-layer, two-layer and multi-layer boards. Preferred embodiments are printed circuit boards having plated through holes capable of forming reliable solder joints whose conductors are protected from solder bridging during assembly and rework by a permanent or temporary seeder repellent mask.

Other objects and advantages of the invention will be set forth in part herein and in part will be obvious herefrom or may be learned by practice with the invention, the same being realized and attained by means of the instrumentalities and combinations pointed out in the appended claims.

As will be clear from the following description, there is used in the manufacture of the circuit boards of this invention certain seeder repellent resinous masks which repel, i.e., are substantially not wetted, by seeding and/or sensitizing solutions commercially used in the manufacture of printed circuit boards. As a result, when such masks contact such solutions, they are either not rendered receptive to electroless metal deposition, or they are rendered receptive to only a minor or minimum degree. Use of the "not-wetted by" seeder resinous masks of this invention leads to considerable savings in production costs of the boards described herein, as well as other advantages.

Although the "not-wetted by" seeder mask composition may take a variety of forms as will be made clear hereinafter, in its preferred embodiment it comprises a resinous material which is itself seeder repellent, or which comprises a constituent which repels wetting by the seeding soluton.

The term "seeder" is used in the sense recognized by those skilled in the art of electroless plating to contemplate means to catalyze or sensitize a substrate to render it receptive to the deposition of an electroless metal. Most frequently palladium-containing solutions are used commercially as seeders.

The term "seeder repellent" as used herein, generically refers to any resinous or plastic material which is not wetted by the solutions employed in the art to render insulating substrata catalytic to the reception of electroless metal, regardless of shape or thickness, and includes thin films and strips as well as thick substrata.

In forming the products described herein, the basic printed circuit patterns are formed on an insulating base by any suitable method, such as printing and etching, or mechanically removing unwanted metal from a preformed metal layer, or merely adhering a pattern of metal lines on the surface of an insulating base, as by means of an adhesive or by means of the so-called additive technique. A preferred procedure is to print a metal clad board with a resist and then form the desired printed circuit pattern by etching in a manner well understood in the art.

In accordance with an embodiment of the present invention, the surface of the base on which a printed circuit pattern has been formed is coated with a mask which is not wetted by the seeder solution. Suitable materials for this mask are described hereinbelow. The mask must have the characteristics of resisting wetting by the seeding solutions, or stated conversely, repelling such solutions. The mask must also be resistant to attack by acids and alkali to which printed circuit boards will ordinarily be subjected in processing, and preferably will have a smooth, glossy surface. Holes defining cross-overs are then formed in the base by any method which does not damage the mask or base materials surrounding the holes, such as by drilling, piercing or punching methods. The next step is to contact the base with a seeder solution to sensitize the walls of the holes to the reception of electroless metal. The non-wettability of the mask will substantially prevent the masked portion of the surface of the board from being rendered sensitive to the electroless metal deposition. Thereafter, the board is thoroughly washed to remove excess seeding solution from the surface and hole walls. Then, the board is contacted with an electroless metal deposition solution to metallize the walls of the holes. The metal deposit can be built up to the required thickness by electroless deposition alone, or when the conductor pattern is suitable, the initial electroless plating can be followed by electroplating.

In practice, it is difficult to achieve complete non-sensitization of the seeder repellent mask when the masked board is treated with the seeder solution. Consequently, when the sensitized board is contacted with the electroless metal solution, metal will frequently deposit in pits or other imperfections or irregularities on the surface of the mask. The amount of metal deposited on the mask, however, will be de minimis, compared to the metal deposit on the exposed, sensitized areas not covered by the mask, e.g., the hole walls. To remedy this situation, the board, following relatively brief contact with the electroless metal deposition solution, is subjected to an etching solution, e.g., a ferric chloride solution when the electroless metal is copper, for a brief period of time, to etch away the slight, random deposit of electroless metal on the seeder repellent mask. This procedure will hereinafter be referred to as a "quick etch" or "quick etching." If desired, it may be repeated a number of times during the electroless metal deposition cycle.

Because of the relative thickness of the plating of electroless metal on the exposed, sensitized areas of the board, compared with the random, non-uniform spot deposition on the masked area, quick etching will have little or no effect on the desirable electroless metal deposit on the exposed, sensitized areas.

Etching solutions commonly used with copper clad stock include ammonium persulfate or ferric chloride. The quick etching operation as described herein may be carried out by either blasting the surface of the panel with a fine spray of the etching solution or immersing the boards to be quick etched in an agitated tank of the etchant. The etching operation is controlled by temperature, the concentration of the etching solution and time of contact, and these variables may be controlled empirically to achieve the desired results. After quick etching, a water rinsing process is employed to remove all etching chemicals and thereby prevent contamination of the surface or edges of the boards.

The seeder repellent mask may be registered or non-registered. If registered, the holes may be formed either before or after hole formation. If non-registered, the mask will usually be imposed before hole formation.

Thus, in the registered mask embodiment, circuit patterns may be formed on one or more surfaces of an insulating base following which holes defining cross-overs are established on the board. Next, a registered seeder repellent mask is printed on the board, leaving the hole walls and, if desired, pads or lands surrounding the holes as well as finger areas, exposed. The board is then contacted with a solution to sensitize the exposed areas to the reception of electroless metal, following which the board is subjected to an electroless metal deposition solution to metallize the exposed areas, including the hole walls.

In the non-registered solder mask embodiment, the base having circuit patterns thereon is coated with the solder mask, following which holes extending through the mask and generally through the base are formed. In this embodiment, the sensitization and electroless metal deposition steps already described are then carried out.

Among the organic resins which may be used to form the insulating bases described herein may be mentioned thermosetting resins, thermoplastic resins and mixtures of the foregoing.

Among the thermoplastic resins may be mentioned the acetal resins; acrylics, such as methyl acrylate; cellulosic resins, such as ethyl cellulose, cellulose acetate, cellulose propionate, cellulose acetate butyrate, cellulose nitrate and the like; chlorinated polyethers; nylon; polyethylene; polypropylene; polystyrene; styrene blends, such as acrylonitrile styrene co-polymers and acrylonitrile-butadiene-styrene copolymers; polycarbonates; polychlorotrifluoroethylene; and vinyl polymers and co-polymers, such as vinyl acetate, vinyl alcohol, vinyl butyral, vinyl chloride, vinyl chloride-acetate co-polymer, vinylidene chloride and vinyl formal.

Among the thermosetting resins may be mentioned allyl phthalate; furane; melamine-formaldehyde; phenol formaldehyde and phenol-furfural co-polymer, alone or compounded with butadiene acrylonitrile co-polymer or acrylonitrile-butadiene-styrene co-polymers, including such co-polymers by themselves; polyacrylic esters; silicones; urea formaldehydes; epoxy resins; allyl resins; glyceryl phthalates; polyesters; and the like.

Since the seeding solutions used to render insulating bases catalytic to the reception of electroless metal are generally aqueous in nature, the seeder repellent mask will generally be hydrophobic, i.e., water repellent, in character.

Typical of the hydrophobic resins which may be used to form such masks are silicone resins, such for example as those disclosed in U.S. Pat. No. 2,937,976; polyethylene resins, such for example, as those disclosed in U.S. Pat. No. 3,224,094; and fluorocarbon resins (e.g., Teflon) such for example, as those described in U.S. Pat. No. 3,203,829; polyurethane resins; acrylic resins; and mixtures of the foregoing. The hydrophobic resins may be used by themselves, but preferably they are used in combination with other resinous materials, for example, any of the resins described above for use as the insulating base, in an amount sufficient to provide the composition with hydrophobic characteristics.

Particularly useful hydrophobic masks may be produced by combining epoxy resins, phenol-formaldehyde resin and silicone resin, as will be made clear hereinafter.

The permanent solder mask compositions should be capable upon curing, of forming a smooth, glossy surface which is resistant to both alkaline and acid solutions ordinarily encountered in producing printed circuit boards using the procedures described herein.

A typical hydrophobic mask composition is given below:

EXAMPLE 1

Part A

| Material: | Amount by weight |
|---|---|
| DEN 438 | 100.0 |
| Butyl carbitol | 51.5 |
| Modaflow | 2.0 |
| Cab-O-Sil M5 | 6.0 |
| Attagel-50 | 5.2 |
| Sarkosyl-O | 1.3 |
| | 166.0 |

Part B

| Material: | Amount by weight |
|---|---|
| Dimethylformamide | 22.5 |
| Dicyandiamide | 4.0 |
| DC #21 | 6.0 |
| TMBDA | 1.2 |
| | 33.7 |

In the formula, DEN 438 is an epoxy novolak (phenol formaldehyde, resin sold by the Dow Chemical Co. Modaflow is a high molecular weight polymer sold by Monsanto. It is used to enhance surface level. Cab-O-Sil M5 is a silica aerogel; Attagel-50 is an aluminum silicate filler. Sarkosyl-O is an oleoyl sarcosine, a cationic wetting agent. DC #21 is a Dow Corning silicone resin; TMBDA is N,N,N',N'-tetramethylbenzyldiamine. In the formula, the Modaflow and DC #21 ingredients provide the composition with hydrophobic characteristics. Both of these ingredients also enhance the surface leveling properties of the composition such that the composition when applied to the insulating base flows out to a smooth level without the formation of ripples or bubbles, so that on drying it produces a smooth, glossy surface.

The Cab-O-Sil and Attagel ingredients are viscosity regulating agents. Butyl carbitol and dimethylformamide are solvents. Dicyandiamide is a curing agent for the epoxy resin and TMBDA acts as an accelerator. In use, Parts A and B are first prepared and then combined. In a preferred embodiment, 166 parts by weight of A are mixed with 33.7 parts by weight of B. Following mixing, the composition may be applied to a suitable base as by brushing or spraying so as to produce a smooth level coating of desired thickness. The composition will cure to a tack free state upon heating for about 10 minutes at 250° F. Cure may be completed by heating at about 270° F. for about 30 minutes.

When the seeding solutions are organic solvent based, mask compositions which are organic solvent repellent, i.e., are not wetted by organic solvents, will be used. Such masks may be referred to as lipophobic.

The non-wettable by seeder solution masks of the present invention include adhesive coated plastic or resinous film material. Such films generally comprise a film sheet coated on one surface with a pressure sensitive adhesive for adherence to a base material. Typical of such adhesive coated masks are fluorinated ethylenepropylene, polyethylene, polypropylene, and the like. Films of such material, treated with pressure sensitive adhesives, are well known to the art. A pressure sensitive adhesive coated polyethylene is commercially available under the trade name Poly Spot Stik. Use of such adhesive coated films avoids the necessity to heat or otherwise cure the nonwettable masks to the base. Such pressure sensitive adhesive masks also have the advantage of being strippable, should stripping be desired.

The seeding and sensitizing solutions used to render the insulating base material sensitive to the electroless metal deposition may take a variety of forms. Thus, the lateral walls of the insulating base surrounding the holes, as well as other exposed areas of the insulating base could be seeded and sensitized by sequential treatment with aqueous solutions of stannous tin ions, or amine boranes, e.g., dialkyl amine boranes, such as dimethylamine borane, morpholine borane, isopropylamine borane, and the like, or alkali borohydrides, such as sodium or potassium borohydride; followed by or preceded by treatment with an aqueous solution of precious metal ions, e.g., palladium. For example, one such treatment involves immersing the perforated insulating base material first in an aqueous acidic solution of stannous chloride, followed by washing, after which the substratum is immersed in an acidic aqueous solution of palladium chloride.

Seeding and sensitizing may also be accomplished by contacting the insulating board as by immersion or spraying with a clear aqueous acidic solution comprising stannous tin ions and precious metal ions in solution. The precious metals which may be used include platinum, gold, rhodium, osmium and iridium, in addition to palladium. Mixtures of such precious metals may also be used.

Examples 2–3 illustrate typical seeder-sensitizer systems of the type described and their method of operation. These systems may be used to render the exposed (not covered by the seeder repellent mask) areas of the insulating boards described herein catalytic to the reception of electroless metal.

EXAMPLE 2

The masked base is rinsed and soaked in an acidified stannous chloride solution having the following composition:

| | Grams |
|---|---|
| Stannous chloride | 50 |
| Hydrochloric acid (12 N) | 50 |
| Water, enough to make 1 liter. | |

The soak in stannous chloride is continued for 10 minutes, and is followed by a rinse first in dilute hydrochloric acid and then in water. The base is then soaked in the following palladium chloride solution for 2 minutes:

| | | |
|---|---|---|
| Palladium chloride | grams/liter | 20 |
| Hydrochloric acid (12 N) | ml./liter | 20 |
| Water | | Remainder |

After thorough rinsing, the areas on the base not covered by the not-wetted by seeder mask, including the walls of any holes thereon, will be sensitive to the reception of electroless metal deposition.

EXAMPLE 3

The masked base, following cleaning, is soaked in a one-part, seeder-sensitizer comprising:

| | | |
|---|---|---|
| Stannous chloride | grams/liter | 70 |
| Palladium chloride | gram/liter | 1 |
| Hydrochloric acid (37%) | ml./liter | 200–300 |
| Water, enough to make 1 liter. | | |

After thorough rinsing in water, the exposed areas of the base, including the walls of any holes in the base, will be receptive to the deposition of electroless metal.

The insulating areas of the boards may be plated electrolessly by contact, following sensitization, with a variety of electroless metal solutions, such as copper, nickel and gold electroless metal solutions. Such plating solutions are well known in the art and are capable of autocatalytically depositing on the catalytic areas the identified metals without the use of electricity.

Electroless copper solutions which may be used are described in U.S. Pat. No. 3,095,309, the description of which is incorporated herein by reference. Conventionally, such solutions comprise a source of cupric ions, e.g., copper sulfate, a reducing agent for cupric ions, e.g., formaldehyde, a complexing agent for cupric ions, e.g., tetrasodium ethylenediaminetetraacetic acid, and a pH adjustor, e.g., sodium hydroxide.

Electroless nickel baths which may be used are described in Brenner, Metal Finishing, November 1954, pages 68 to 76, incorporated herein be reference. They comprise aqueous solutions of a nickel salt, such as nickel chloride; an active chemical reducing agent for the nickel salt, such as the hypophosphite ion; and a complexing agent, such as carboxylic acids and salts thereof.

Electroless gold plating baths which may be used are disclosed in U.S. Pat. No. 2,976,181, also incorporated herein by reference. They contain a slightly water soluble gold salt, such as gold cyanide, a reducing agent for the gold salt, such as the hypophosphite ion, and a chelating or complexing agent, such as sodium or potassium cyanide. The hypophosphite ion may be introduced in the form of the acid or salts thereof, such as the sodium calcium or the ammonium salts. The purpose of the complexing agent is to maintain a relatively small portion of the gold in solution as a water soluble gold complex, permitting a relatively large portion of the gold to remain out of solution as a gold reserve. The pH of the bath will be about 13.5, or between about 13 and 14, and the ion ratio of hypophosphite radical to insoluble gold salt may be between about 0.33 and 10 to 1.

A specific example of electroless copper depositing baths suitable for use will now be described:

EXAMPLE 4

| | Moles/liter |
|---|---|
| Copper sulfate | 0.03 |
| Sodium hydroxide | 0.125 |
| Sodium cyanide | 0.0004 |
| Formaldehyde | 0.08 |
| Tetrasodium ethylenediaminetetraacetate | 0.035 |
| Water | Remainder |

This bath is preferably operated at a temperature of about 55° C. and will deposit a coating of ductile electroless copper about 1 mil thick in about 51 hours.

Utilizing the electroless metal baths of the type described, very thin conducting metal films may be laid down. Ordinarily the metal films superimposed by electroless metal deposition will range from 0.1 to 7 mils in thickness, with metal films having a thickness of even less than 0.1 mil a distinct possibility.

The invention is more fully described hereinafter with reference to the accompanying drawing which represents diagrammatically the steps in the formation of the plated through hole printed circuit boards according to the present invention.

The process for producing the preferred plated through hole boards of this invention is illustrated in the successive steps of FIG. 1. In FIG. 1A is shown an insulating base 10 having on both surfaces a thin metal film 12. In FIG. 1B, circuit patterns 14 and 16 have been imposed on the base 10 by standard print and etch techniques. In FIG. 1C, relatively thick, insulating hydrophobic masks 18 and 20, e.g., having the composition of Example 1, have been superimposed on each of the circuit patterns 14 and 16, respectively. Next, as shown in FIG. 1D, holes or apertures 22 are made which extend through the base 10 and hydrophobic masks 18 and 20. The holes may be formed by any suitable method, such as piercing, punching or drilling.

The board is next treated as described, for instance, in Example 2 or 3, to render the walls of the holes 22 catalytic to the reception of electroless metal, as shown at 24 of FIG. 1E. The board is then washed to remove any sensitizing solution which may have remained on the surface of the masks 18 and 20 and to remove any excess solution which may have been retained on the hole walls 22 following removal of contact of the base with the sensitizing solution. The hydrophobic masks 18 and 20 will not be rendered catalytic to the reception of electroless metal by treatment with the seeding solution, since such masks will not be wetted and will repel the seeding solution.

Thus, there is achieved by the practice of this invention, a selective seeding of the hole walls to the reception of electroless metal, without however rendering the exposed surface of the boards catalytic to the reception of electroless metal.

Next, the board is contacted with an electroless metal deposition solution, e.g., the copper solution of Example 4, to deposit metal on the walls surrounding the holes as shown at 26 of FIG. 1F. After exposure to the electroless copper solution for a brief time, e.g., one-half to one hour, the board is "quick etched" by dipping in a solution of ferric chloride for a few seconds or more to remove any random deposit of copper which may have deposited on the mask. The electroless metal deposition may be continued for as long as desired, but preferably until beads of metal 28, as shown in FIG. 1G, form on the surface of the masks 18 and 20. These beads 28 serve the function of lands or pads. As shown in FIG. 1G, the beads 28 are nonplanar with the conductor lines 14. The beads 28 facilitate dip soldering of the boards. Without them, the solder has a tendency to aggregate at the surfaces of the boards, leaving portions of the hole walls uncoated with solder.

The "quick etch" treatment may be repeated one or more times as required during the electroless metal deposition cycle.

In the electroless deposition of metal on the hole walls, it should be pointed out that the metal deposit 26 will grow in three dimensions. Thus, the formation of the beads 28 requires the board to be in contact with the electroless metal deposition solution for a long enough time to permit the metal deposit on the hole walls to grow vertically over the mask 18.

Figure 2:
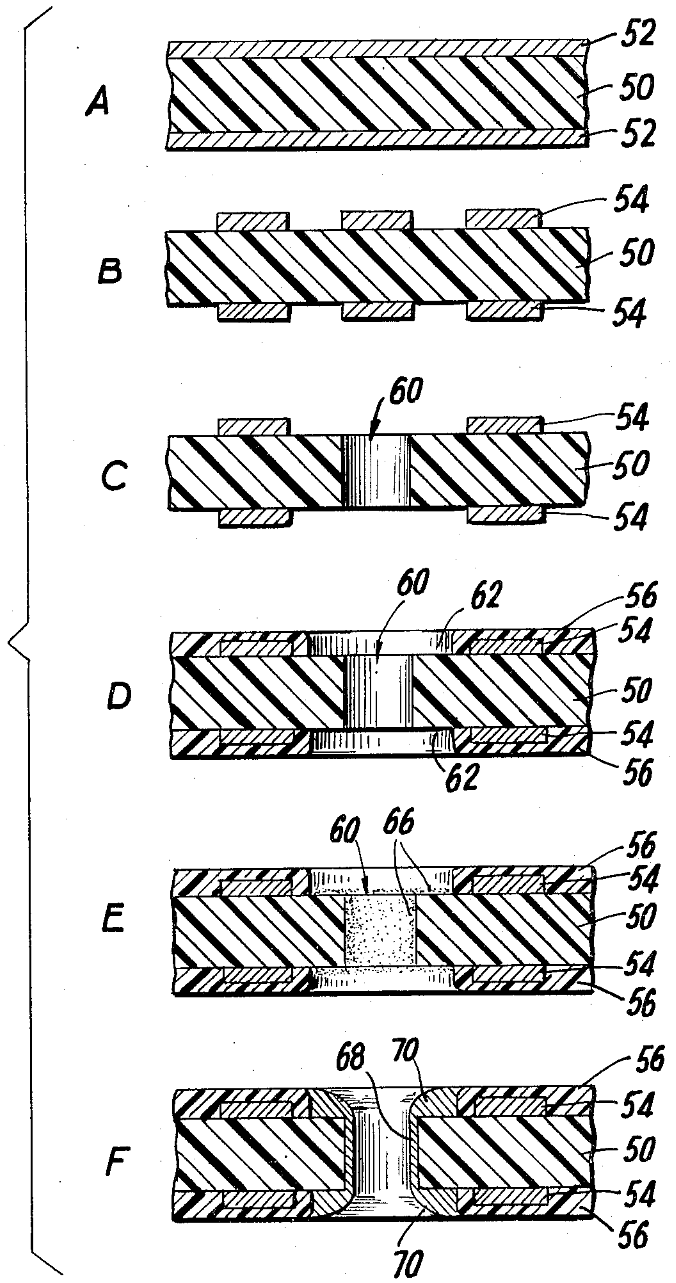

In FIG. 2 there is shown an alternative embodiment of the invention using a registered hydrophobic mask. In FIG. 2A is shown an insulating base 50 coated on both surfaces with a thin metal film 52. Circuit patterns 54 have been superimposed on both surfaces of the base 50 by the standard print and etch techniques in FIG. 2B. In FIG. 2C, holes 60 have been formed in the board by any suitable method such as piercing, punching and drilling. In FIG. 2D, relatively thick, insulating hydrophobic masks 56 have been superimposed on each of the circuit patterns 54. The masks 56 are registered so as to leave the holes 60 as well as land areas 62 surrounding the holes (as well as finger areas, not shown, if desired) exposed. Next, the board is seeded as described for instance in Example 2 or 3 to render the walls of the holes and the land areas surrounding the holes catalytic to the reception of electroless metal as shown at 66 in FIG. 2E. Because of the hydrophobic nature of the mask 56, the surfaces of the mask are not rendered catalytic to the reception of electroless metal by the seeder treatment. Next, the board is washed to remove any sensitizing solution which may have remained on the surface of the mask 56 and to remove any excess solution which may have been retained on the walls of the holes 60 following contact of the base with the sensitization solution.

Next, the board is contacted with an electroless metal solution to deposit metal on the walls surrounding the holes as shown at 68 and also on the land areas 60 surrounding the holes, to build up lands 70. The final board has the appearance shown in FIG. 2F. Here again, the electroless metal deposition cycle may be interrupted one or more times by a "quick etch" as described supra, in connection with the FIG. 1 embodiment.

Figure 3:
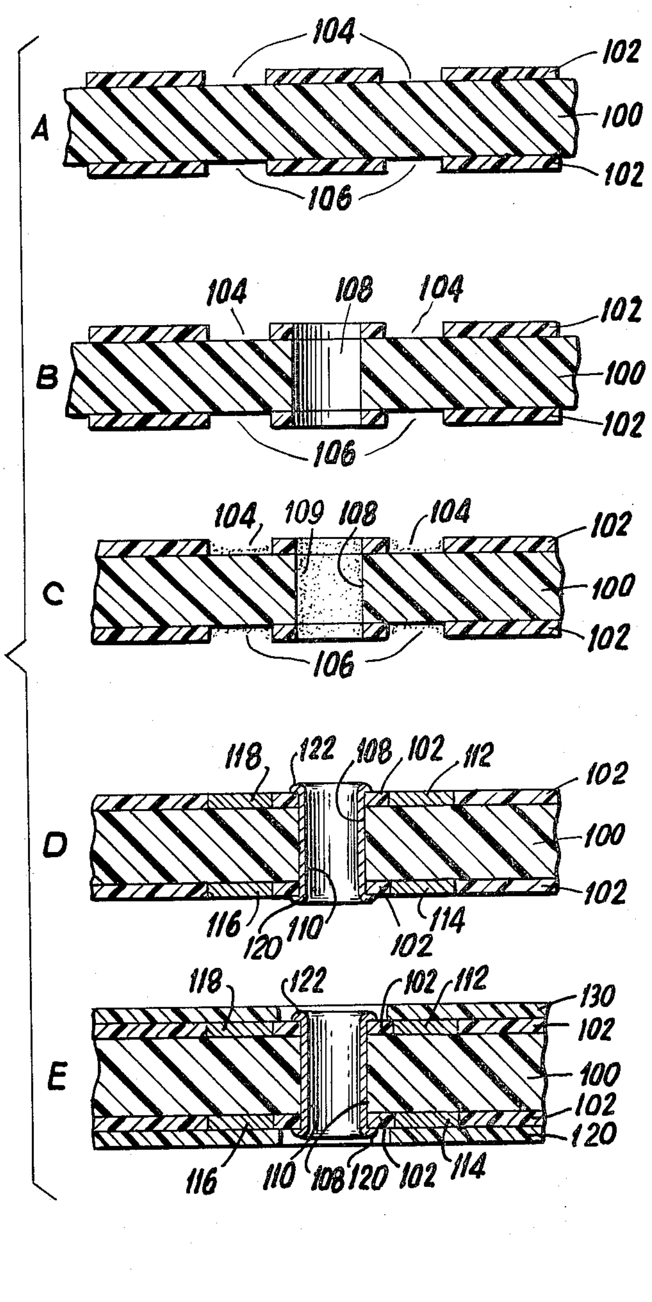

The hydrophobic masks described herein may also be utilized in the manufacture of printed circuit boards by the so-called additive technique. Such an embodiment is exemplified by FIG. 3.

In FIG. 3A, there is shown an insulating base 100 on which has been printed a hydrophobic mask 102 so as to leave exposed areas 104 and 106 in the form of desired printed circuit patterns. Next, as shown in FIG. 3B holes or apertures 108 extending through the base 100 are provided. Here again, the holes may be formed by any suitable method. The board is next seeded, as described for instance in Example 2 or 3, supra, to render the walls 110 of the holes 108, as well as the exposed circuit patterns 106 and 104 catalytic to the reception of electroless metal. The board is then washed to remove any excess solution which may have been retained on the exposed board areas following its removal from the sensitizing solution. Here again, the hydrophobic mask 102 will not be rendered catalytic to the reception of electroless metal by treatment with the seeding solution since such masks will not be wetted and will repel the seeding solution. Next, the board is contacted with an electroless deposition solution to deposit metal on the walls surrounding the holes as shown at 110, FIG. 3D. Simultaneously, electroless metal will deposit on the exposed areas of the circuit pattern as shown at 112, 114, 116 and 118. There are then formed circuit patterns (112, 118, 114 and 116) on the top and bottom surfaces of the board 100 by electroless deposition. Simultaneously, plated hole walls 110 with beads 122 are formed by permitting the board to contact the electroless deposition solution for a sufficient period of time. As shown in FIG. 3D, the beads 122 overlap the hydrophobic mask 102 surrounding the holes 108. Here again, plating may be interrupted one or more times by the quick etching step described, supra, FIG. 1. The final board has the appearance shown in FIG. 3D. If desired, as registered solder mask 130 may be coated over the bottom and top surfaces of the board to produce a board of the type shown in FIG. 3E.

Although the invention has been described with particular reference to plated through hole two-sided printed circuit boards, it is equally applicable to the production of one sided boards, with or without holes. Similarly, it is applicable to the production of multi-layered, i.e., more than two, layered boards. Similarly, the invention is applicable to selective metallization of insulating bases in general, so as to produce for example, decorative or other articles, automotive trim, and the like, where only predesignated portions of whose surfaces are to be coated with metal.

The invention in its broadest aspects is not limited to the specific steps, methods, compositions and improvements shown and described herein, but departures may be made within the scope without departing from the principles of the invention.

What is claimed is:

1. In the manufacture of plated through hole printed circuit boards which includes the step of imposing a printed conductive circuit pattern on at least one surface of an insulating base, the improvement which comprises: (a) forming holes in the insulating base at preselected points; (b) applying a hydrophobic seeder-repellent insulating mask over at least portions of said conductive circuit pattern, leaving the holes exposed, said mask being characterized by the ability not to be wetted by electroless metal seeder solution; (c) contacting the resulting board with said seeder solution to render the hole walls but not the exposed surface of the hydrophobic mask sensitive to the reception of electroless metal; and (d) contacting the resulting board with an electroless metal deposition solution to deposit electroless metal on the exposed areas of the base including the hole walls, but not on the exposed surface of the hydrophobic mask.

2. The method of claim 1 wherein the board is treated with an etching solution following treatment with the electroless metal solution to remove minor deposits of metal on the mask, while leaving the electroless metal deposit on said exposed areas substantially unimpaired, said etching solution being capable of dissolving the electroless metal.

3. In the manufacture of plated through hole printed circuit boards which includes the step of imposing a printed circuit pattern on at least one surface of an insulating base, the improvement which comprises: (a) forming holes in the insulating base at preselected points; (b) applying a hydrophobic insulating mask on said circuit pattern, leaving the holes exposed, said mask being characterized by the ability not to be wetted by and therefore essentially repellent of an aqueous one-part electroless metal seeder solution; (c) contacting the resulting board with a clear aqueous one-part seeder comprising stannous ions and precious metal ions in solution to render the hole walls but not the exposed surface of the hydrophobic mask sensitive to the reception of electroless metal; (d) contacting the resulting board with an electroless metal deposition solution to deposit electroless metal on the exposed areas of the base including the hole walls, but not on the exposed surface of the hydrophobic mask; and (e) treating said board with an etching solution to remove minor deposits of metal on the mask while leaving the electroless metal deposit on said exposed areas substantially unimpaired, said etching solution being capable of dissolving the electroless metal.

4. In a method for manufacturing plated through hole printed circuit boards which includes imposing a printed circuit pattern on at least one surface of an insulating base, the improvement which comprises: (a) applying a permanent insulating hydrophobic mask over at least a portion of said printed circuit pattern, said mask being characterized by an ability not to be wetted by electroless metal seeder solution; (b) producing at least one hole which extends into the insulating base; (c) contacting the resulting board with a clear aqueous one-part seeder comprising stannous ions and precious metal ions in solution to render the walls of the insulating base surrounding the hole but not the mask surface sensitive to the reception of electroless metal; (d) contacting the resulting board with an electroless metal deposition solution to metallize the insulating wall surrounding said hole while simultaneously leaving the mask surface substantially free of electroless metal, and treating the resulting board with an etching solution capable of dissolving said electroless metal to remove minor deposits of metal on the mask while leaving the electroless metal deposit on said exposed areas substantially unimpaired.

5. The method of claim 4 wherein the permanent hydrophobic insulating mask comprises a member selected from the group consisting of silicone resin, polyethylene resin, fluorocarbon resin, polyurethane resin, acrylic resin and mixtures of the foregoing.

6. The method of claim 4 wherein the hydrophobic insulating mask is a permanent, nonregistered mask, and wherein the hole extends through the hydrophobic insulating mask and into the insulating base to have the hole walls provided by the base and mask in alignment.

7. The method of claim 4 wherein the mask is applied unselectively over the printed circuit pattern through which a hole is to be produced, the hole subsequently being formed through the nonregistered insulating mask and into the insulation base.

References Cited

UNITED STATES PATENTS

| | | | |
|---|---|---|---|
| 2,848,359 | 8/1958 | Talmey | 117—212 |
| 3,134,690 | 5/1964 | Erikson | 117—213 |
| 3,269,861 | 8/1966 | Schneble et al. | 117—212 |
| 3,340,607 | 9/1967 | Schutt | 29—625 |

FOREIGN PATENTS

| | | | |
|---|---|---|---|
| 1,301,385 | 7/1962 | France | 174—68.5 |

WILLIAM A. POWELL, Primary Examiner

U.S. Cl. X.R.

117—47, 212, 213; 156—8